US008659108B2

(12) United States Patent
Van Niewenhove et al.

(10) Patent No.: US 8,659,108 B2
(45) Date of Patent: Feb. 25, 2014

(54) PHOTOSPECTROMETER

(75) Inventors: Daniel Van Niewenhove, Hofstade (BE); Ward Van Der Tempel, Muizen (BE); Maarten Kuijk, Berchem (BE)

(73) Assignee: Softkinetic Sensors N.V., Brussel (BE)

( * ) Notice: Subject to any disclaimer, the term of this patent is extended or adjusted under 35 U.S.C. 154(b) by 479 days.

(21) Appl. No.: 12/812,853

(22) PCT Filed: Jan. 19, 2009

(86) PCT No.: PCT/EP2009/050557
§ 371 (c)(1),
(2), (4) Date: Oct. 26, 2010

(87) PCT Pub. No.: WO2009/090263
PCT Pub. Date: Jul. 23, 2009

(65) Prior Publication Data
US 2011/0063614 A1    Mar. 17, 2011

(30) Foreign Application Priority Data
Jan. 17, 2008 (EP) .................................... 08150377

(51) Int. Cl.
*H01L 31/00* (2006.01)
(52) U.S. Cl.
USPC ....................................................... 257/440
(58) Field of Classification Search
USPC ............... 356/326; 257/431, 440; 250/370.01
See application file for complete search history.

(56) References Cited

U.S. PATENT DOCUMENTS

| 1,799,134 | A | * | 3/1931 | Hardy | 356/319 |
| 3,100,264 | A | * | 8/1963 | Jaffe et al. | 250/203.6 |
| 4,093,991 | A | * | 6/1978 | Christie et al. | 356/319 |
| 4,560,275 | A | * | 12/1985 | Goetz | 356/326 |
| 4,885,620 | A | * | 12/1989 | Kemmer et al. | 257/428 |
| 6,987,268 | B2 | * | 1/2006 | Kuijk et al. | 250/370.01 |
| 2005/0051730 | A1 | * | 3/2005 | Kuijk et al. | 250/370.01 |

FOREIGN PATENT DOCUMENTS

| DE | 3415426 A1 * 10/1985 | ............. H01L 31/10 |
| EP | 0205050 A2 12/1986 | |
| EP | 1513202 A1 3/2005 | |
| WO | 2007115312 A2 10/2007 | |

OTHER PUBLICATIONS

Daniel Van Nieuwenhove et al.: "Photonic Demodulator with Sensitivity Control", IEEE Sensors Journal, IEEE Service Center, New York, NY US, vol. 7, No. 3, Mar. 1, 2007, pp. 317-318, XP011161742.
International Search Report in PCT/EP2009/050557, Mar. 30, 2009.

* cited by examiner

*Primary Examiner* — Kara E Geisel
(74) *Attorney, Agent, or Firm* — Bacon & Thomas, PLLC

(57) ABSTRACT

Impinging electromagnetic radiation generates pairs of majority and minority carriers in a substrate. A spectrometer device for detection of electromagnetic radiation impinging on a substrate comprises means for generating, in the substrate, a majority carrier current; at least one detection region for collecting generated minority carriers, the minority carriers being directed under influence of the majority carrier current; and means for determining spectral information based on minority carriers collected at the at least one detection region.

20 Claims, 8 Drawing Sheets

PHOTOSPECTROMETER

TECHNICAL FIELD OF THE INVENTION

The present invention relates to photospectrometry. In particular, the present invention relates to a method and a device for detection of electromagnetic radiation impinging on a substrate.

BACKGROUND OF THE INVENTION

The goal of photospectrometry is retrieving spectral information of a source of electromagnetic radiation, e.g. a light source, often to be able to extract information about the source itself. Photospectrometry is widely used in the biological and pharmaceutical sciences to identify molecular structures or to detect the presence of certain molecules in gases and solutions. This can be done, among other techniques, by measuring the spectrum a sample under test emits after excitation with an energy source, as in Raman spectroscopy, or for example by measuring the absorption spectrum of a sample under test.

Traditionally two types of techniques are used to extract spectral information. The first type offers the cheapest solution and involves only looking at just one fraction of the spectrum. This solution can be implemented by combining an optical bandpass-filter with a single detector. The second type involves splitting the spectrum by means of prisms or other diffractive, refractive or interferometric optical components and directing the resulting spectrum, split in space, towards an array of detectors, each detector, when looking at the system as a whole, being responsive to only a portion of the total spectrum. Embodiments conform to this type of spectrometry can be found for example in EP-0205050. A similar technique described in WO 2007/115312 uses a dispersive optical component to split the spectral information in time allowing a single detector to measure the spectrum in time.

The above known types of detection techniques involve the use of extra optical components such as filters, or diffractive, refractive, interferometric or dispersive components, which increases the complexity and cost of a photospectrometer.

SUMMARY OF THE INVENTION

It is an object of embodiments of the present invention to provide good apparatus or methods for performing photospectrometry, i.e. for retrieving spectral information of a source of electromagnetic radiation, e.g. for identifying an unknown spectrum of a source of electromagnetic radiation.

The above objective is accomplished by a method and device according to the present invention.

In a first aspect, the present invention provides a spectrometer device for detection of electromagnetic radiation impinging on a substrate. The impinging electromagnetic radiation generates pairs of majority and minority carriers in the substrate. The detector device comprises means for generating, in the substrate, a majority carrier current; at least one detection region for collecting generated minority carriers, the minority carriers being directed under influence of the majority carrier current; and means for determining spectral information based on the minority carriers collected at the at least one detection region. The direction of the minority carriers is towards at least one detection region. The determined spectral information may, for example, be spectral response curves. In alternative embodiments, the spectral information may be a series or a plurality of spectral values. In embodiments of the present invention, the detector device comprises a plurality of detection regions.

Determining spectral information based on the collected minority carriers may be performed by measuring the minority currents related to the number of minority carriers being directed by the majority carrier current and collected at the at least one detection region, and optionally processing these minority currents, e.g. by multiplying them with a weight factor. This way, minority carrier currents or processed minority carrier currents may be compared with each other, and the spectral response sensitivity of the at least one detection region for a particular type of impinging electromagnetic radiation may be determined.

The substrate may be a semiconductor substrate. It is an advantage of embodiments of the present invention that a solid state photospectrometer is provided. It is an advantage of embodiments of the present invention that a simple solid state photospectrometer is provided, without need for extra optical filters, nor diffractive, refractive, interferometric or dispersive components. It is furthermore an advantage of embodiments of the present invention that photospectrometers with reduced complexity and cost are provided.

A spectrometer device according to embodiments of the present invention may furthermore comprise at least one current source region and at least one current drain region, the means for generating the majority carrier current being adapted for generating this majority carrier current between the at least one current source region and the at least one current drain region.

A spectrometer device according to embodiments of the present invention may furthermore comprise readout means for reading out the minority carriers collected in the at least one detection region. The readout means may comprise a transimpedance amplifier. An advantage of using a transimpedance amplifier is that the voltage applied on the detection regions can be held constant irrespective of the detection currents.

In a spectrometer device according to embodiments of the present invention minority carriers may travel to the at least one current source region by drift and may be captured by a depletion region of a detection region in their path.

A spectrometer device according to embodiments of the present invention may furthermore comprise means for comparing the determined spectral information, e.g. spectral response curves, with pre-determined sets of spectral information, e.g. pre-determined sets of spectral response curves. A pre-determined set of spectral information, e.g. a pre-determined set of spectral response curves, may closely copy the Red-Green-Blue spectral information, e.g. spectral response curve set, present in the human eye. It is hence another advantage of embodiments of the present invention that a solid state color sensor is provided.

A spectrometer device according to embodiments of the present invention may furthermore comprise means for changing a parameter of the majority carrier current in the substrate. The parameter may be any of polarity, amplitude, shape and/or modulation frequency of the majority carrier current. It is an advantage of embodiments of the present invention that a solid state photospectrometer with controllable windowing in time is provided. Such controlled windowing in time may be used for determining the active window in time wherein the spectrum of electromagnetic radiation, e.g. light, captured by the spectrometer device is measured.

A spectrometer device according to embodiments of the present invention may furthermore comprise at least one supplementary detection region for collecting generated minority carriers, the at least one detection region and the at least one supplementary detection region being arranged so that either of these is able to collect minority carriers, depending on the value set for the parameter of the majority carrier current in the substrate. In this way, a spectrometer device is obtained which can measure spectral information of an unknown spectrum in time.

According to a further aspect, the use of a detector device according to embodiments of the present invention in a spectrometer application is provided.

In yet another embodiment of the present invention a method is provided for performing spectrometry of electromagnetic radiation impinging on a substrate. The impinging electromagnetic radiation generates pairs of majority and minority carriers in the substrate. The method comprises generating a majority carrier current in the substrate; directing generated minority carriers under influence of the generated majority carrier current, and collecting the minority carriers at the at least one detection region; and determining spectral information, e.g. spectral response curves, for minority carriers collected at the at least one detection region. In embodiments of the present invention, the minority carriers are collected at a plurality of detection regions. The direction of the minority carriers is towards at least one detection region.

A method according to embodiments of the present invention may furthermore comprise providing sets of spectral information, e.g. sets of spectral response curves, for the at least one detection region, and comparing the determined spectral information, e.g. spectral response curves, with the provided sets of spectral information, e.g. spectral response curves.

Providing sets of spectral information, e.g. spectral response curves, for the at least one detection region may comprise determining spectral information, e.g. spectral response curves, for minority carriers collected at the at least one detection region when the electromagnetic radiation impinging on the substrate is electromagnetic radiation with a known spectrum. Providing sets of spectral information, e.g. spectral response curves, for the at least one detection region may furthermore comprise determining spectral information, e.g. spectral response curves, for minority carriers collected at the at least one detection region with a majority carrier current with known parameters being generated.

In a further aspect, the present invention provides a controller for controlling spectrometry of electromagnetic radiation impinging on a substrate, the impinging electromagnetic radiation generating pairs of majority and minority carriers in the substrate. The controller comprises control means for controlling generation of a majority carrier current in the substrate, thus directing generated minority carriers under influence of the generated majority carrier current, and collecting the minority carriers at the at least one detection region; and calculating means for determining spectral information, e.g. spectral response curves, for minority carriers collected at the at least one detection region.

The present invention provides a computer program product for executing any of the methods according to embodiments of the present invention when executed on a computing device associated with a spectrometer. The present invention also provides a machine readable data storage storing the computer program product according to embodiments of the present invention. The present invention provides transmission of signals representing the computer program product of embodiments of the present invention over a local or wide area telecommunications network.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 6B illustrates a cross-section of the photospectrometer according to the embodiment illustrated in FIG. 6A, when the detection regions on the right-hand side of the optically sensitive area are ON.

DESCRIPTION OF ILLUSTRATIVE EMBODIMENTS

Figure 1A:
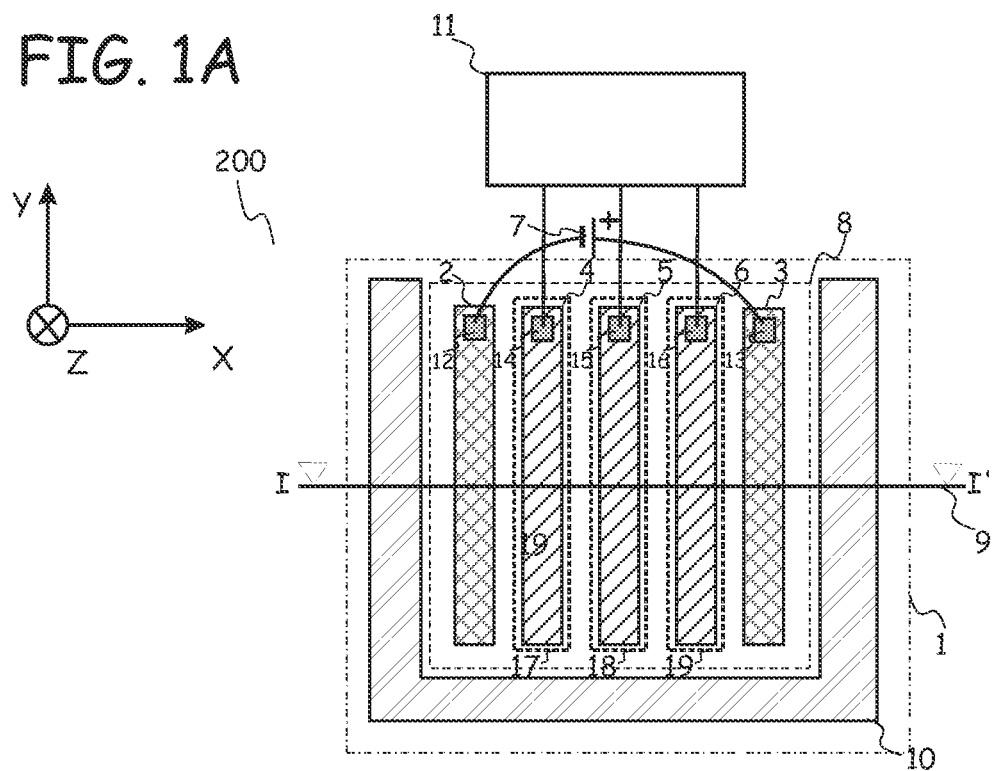
FIG. 1A illustrates a photospectrometer in accordance with a first embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Furthermore the findings of the present invention are explained with reference to a p–substrate as an example, but the present invention includes within its scope a complementary device whereby p and n-regions become n and p-regions, respectively. Depending on the type of substrate, the majority carrier current is a hole current or an electron current. A skilled person can make such modifications without departing from the invention as defined by the appended claims.

Furthermore, it is to be noticed that the term "light" should not be interpreted as being only the part of the electromagnetic spectrum which is visible. Thus, the term light should be interpreted as being interchangeable with any electromagnetic radiation.

Furthermore, it should be noted that the term "n+ detection region" as used in the description should not be thought of as being limited to only n+ detection regions. Any other detection region suitable for detection of minority carriers in majority carrier type substrates, such a photo-gates and Schottky contacts, are also included within the scope of the description.

In US2005051730 a detector for electro-magnetic radiation is described based on the use of a small majority carrier current to induce an electric field in the substrate. This electric field provides fast transportation towards a detection region with very low parasitic capacitance. The result is a detector with high sensitivity. The present invention will exploit the electric field induced in the substrate by a majority carrier current to create detection region with bandpass filter responses to the impinging electromagnetic radiation. US2005051730 is incorporated herewith in its entirety.

Figure 1B:
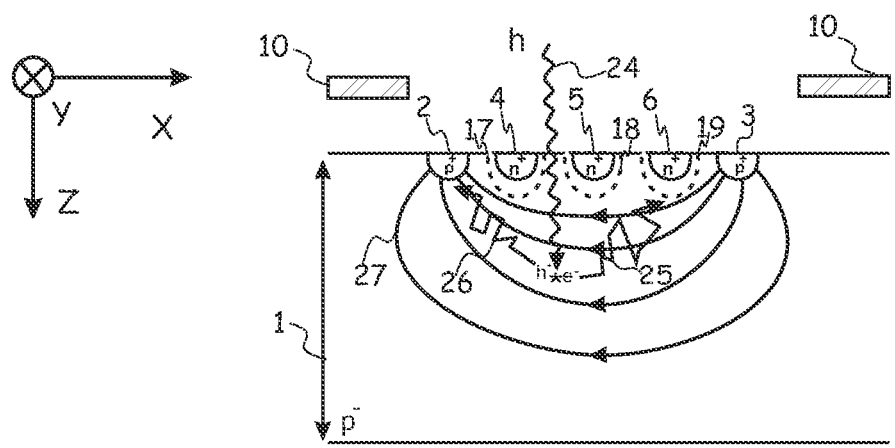
FIG. 1B illustrates a cross-section of the photospectrometer according to the first embodiment as depicted in FIG. 1A.

FIG. 1A shows the top view of a photo-spectrometer 200 according to a first embodiment of the present invention. FIG. 1B shows a cross-section according to line I-I' in FIG. 1A. The photo-spectrometer 200 comprises a resistive, lightly doped semiconductor substrate 1 having a first conductivity type, in the example given a p-type substrate. The lightly doped semiconductor substrate 1 has a doping level ranging from intrinsic (undoped) to a doping level corresponding to a volume resistivity of about 20 Ohm.cm.

In embodiments of the present invention, the term "substrate" may include any underlying material or materials that may be used, or upon which a spectrometer device may be formed. In embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest, the layer or portion of interest being the lightly doped semiconductor material.

On or in the substrate, conductive regions, for example highly doped regions having the first conductivity type, e.g. p+-regions 2 and 3 respectively, are provided. Alternatively, the conductive regions could be metal regions, thus forming a schottky contact (metal-semiconductor). The highly doped regions 2, 3, if semiconductor regions, have a doping level higher than the doping level of the lightly doped substrate. These highly doped regions 2, 3 are provided with contacts 12, 13 respectively, for connection to a current source 7. Source 7 injects current at contact 13 and drains current at contact 12. Contacts 12 and 13 connect through ohmic-conduction to the highly doped regions having a first conductivity type, e.g. p+-regions 2 and 3 respectively. In the resistive, lightly doped substrate 1 having the first conductivity type, a majority carrier current, in the case of a substrate being p– substrate a hole current 27, will flow from region 3 to region 2. The photo-spectrometer 200 furthermore comprises on or in the substrate 1 at least one, and preferably a plurality of detection regions 4, 5, 6. A detection region can be, but is not limited to, a highly doped region, e.g. having a doping level above $10^{18}/cm^3$, of a second conductivity type, the second conductivity type being different from the first conductivity type, in the present example an n+ type region. In alternative embodiments the detection region can be a nwell photodiode, a pinned photodiode, a photogate, or a schottky diode, for example.

In FIG. 1B, the majority hole current 27 is shown by the solid lines whereby the direction of the hole current 27 is indicated by the arrows. In the substrate 1, where the doping is typically considered to be constant, the majority carrier current 27 is associated with an electric field, in the direction of the current. The photo-spectrometer 200 of the embodiment illustrated has a sensitive area 8, e.g. an area onto which electromagnetic radiation such as light to be detected can impinge. The sensitive area is surrounded by a radiation shielding, e.g. a shielding metal 10. If incident electromagnetic radiation such as light in the form of a photon 24 is incident within the sensitive area 8 of the detector, the energy associated with the photon 24 is absorbed by the substrate 1, and a reaction takes place that generates an electron hole pair, at a predetermined position and depth, determined by the energy of the photon 24 and the material and dopant level of the substrate 24.

In FIG. 1B, as an example, the electron hole pair generation due to impinging of a photon 24 onto the sensitive area of the spectro-photometer 200 is considered to occur at the location indicated with a star: "*". One charge carrier of the electron hole pair e–/h+, the majority carrier, in the present example the hole h+, will become indistinguishable from the sea of majority carriers, holes in this example, of the flowing majority carrier current 27, and will follow a path in a direction determined by the flowing majority carrier current 27, for example trajectory 26. The minority carrier of the electron hole pair e–/h+, in this example the electron e–, will move as a result of superposition of separate forces.

The first force is caused by the same electrical field associated with the flowing majority carrier current 27 and will cause the electron e– to move in the opposite direction (due to its negative charge).

Furthermore, a built-in electric field is present in the vicinity of the detection regions 4, 5 and 6, more specifically in the depletion regions 17, 18 and 19 surrounding the detection regions 4, 5 and 6 respectively. If the electron e– is moved due to the first force towards one of the depletion regions, in the example illustrated for example depletion region 19, a second force caused by the built-in electric field in the depletion region will move the electron towards the corresponding detection region 6.

These 2 forces, in combination with diffusion and interaction with phonons, generate the erratic path 25 of the electron e–. In this example the electron is moved to detection region 6, thus producing a detectable current through the ohmic contact, in this example contact 16.

In general more than 1 photon reaches the sensitive area 8 of the device 200. When irradiating the device 200 with electromagnetic radiation such as light, the resulting currents detected at the detection areas 4, 5 and 6 are a function of the spatial intensity-distribution of the radiation and the spectrum of the radiation. These currents can then be read-out by means of a read-out circuit 11. If the spatial intensity-distribution of the electromagnetic radiation, e.g. light, over the sensitive area 8 is known, then, since the penetration depth of the electromagnetic radiation, e.g. light, is depending on the wavelength, the resulting currents of detection regions 4, 5 and 6 are depending on the wavelength or spectrum of the electromagnetic radiation, e.g. light.

Figure 1C:
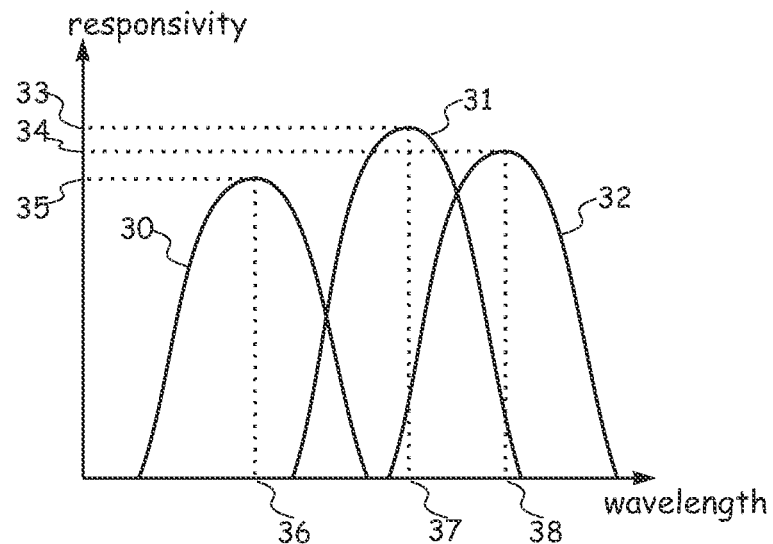
FIG. 1C illustrates a possible set of optical response curves.
Figure 1D:
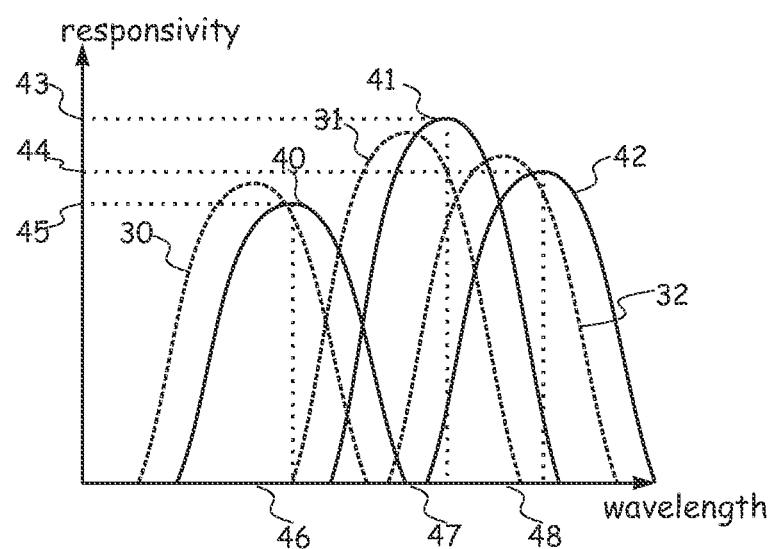
FIG. 1D illustrates another set of optical response curves obtained by changing the electric field in de substrate.

To understand how this is happening, examine the path of the electromagnetic radiation, e.g. light, in the form of a photon 24. If electromagnetic radiation, e.g. light, would impinge on the device only along the path of photon 24, the probability of photons generating electron hole pairs deeper along this ray in the substrate 1 is proportional to the wavelength of the electromagnetic radiation, e.g. light. The electric field caused by the majority carrier current 27 will propel the electrons generated deeper in the substrate 1 more towards, in the example illustrated, the right detection region 6. In contrast, the electrons generated closer to the surface will more likely be detected by, in the example illustrated, detection regions 4 and 5. In this way, the electric field caused by the majority carrier current 27 is differentiating the spectral response of the different detection regions, in the example illustrated detection regions 4, 5 and 6. FIG. 1C shows, as an example only, possible spectral information, e.g. spectral responses 30, 31 and 32, which will be called spectral response curves hereinafter, of each distinct detection region 4, 5 and 6 respectively, obtained with a certain amplitude of current injected by source 7. Each spectral response curve 30, 31 and 32 has a peak response 35, 33 and 34 at a wavelength 36, 37 and 38 respectively. Additionally, these spectral responses 30, 31 and 32 can be shifted in the spectrum by changing the polarity, modulation frequency, strength and/or shape of the electric field associated with the flowing majority carrier current 27. FIG. 1D shows, as an example only, a possible shift of the spectral response curves, creating a new spectral response curve-set 40, 41 and 42 with peak response 45, 43 and 44 at wavelengths 46, 47 and 48 respectively. This change of the electric field in the substrate 1 is obtained by changing a parameter, for example by changing the amplitude, of the current injected by current source 7, or by connecting or coupling current source 7 to different inject or drain regions, or in any other suitable way. In this way, a set of spectral information, e.g. spectral response curves, can be constructed of m times n spectral data, e.g. response curves, m being the number of detection regions and n being the number of different electric fields that can be produced, e.g. by changing the strength of the electric field, or by selecting inject and drain regions at different distances. Thus a device comprising one or more detection regions and comprising means to manipulate the polarity, modulation frequency, strength and/or shape of the electric field can be used to determine spectral information of an unknown impinging electromagnetic radiation.

To be able to measure an arbitrary spectrum, the device should, for example, first be calibrated with known illumination sources to extract the set of spectral information, e.g. the spectral response curve set. The set of spectral information, e.g. spectral response curve set, comprises for each known illumination source corresponding spectral information, e.g. a corresponding spectral response curve. Once the set of spectral information, e.g. the spectral response curve-set, has been identified, for example through experiment or simulation, the problem of finding the unknown spectrum out of a discrete number of measurements using the spectral information, e.g. the discrete number of spectral response curves, in the set of spectral information, e.g. in the spectral response curve set, is reduced to an inverse problem which can be solved. Suitable solution algorithms are, for example, the constrained inversion method or the Backus-Gilbert method. These calculations can be, for example, performed off-line with a computer or in a microprocessor. The accuracy of the extracted spectrum is depending on the spectral information, e.g. the number of spectral response curves, in the set of spectral information, e.g. in the spectral response curve set, the spreading on the spectral information, e.g. the spectral width of the spectral response curves in the spectral response curve set, and the signal-to-noise ratio of the measured detection current.

The embodiment of the photo-spectrometer 200 shown in FIG. 1A can be modified to increase the number of detection regions to expand the amount of spectral information in the set of spectral information, e.g. the number of spectral response curves in the spectral response curve set. Furthermore, to limit the spreading on the spectral information, e.g. to limit the spectral width of the individual spectral response curves, it is preferable to use a minimum pitch between the detection regions as allowed by the used technology, as well as shallower junctions available in the used technology. A person skilled in the art can use device simulators (such as ATLAS from Silvaco, for example) or other calculation means or trial and error to engineer a suitable set of spectral information, e.g. a suitable set of spectral response curves, by determining the optimal set of electric fields induced by source 7, the optimal detection region pitch and optimal number of detection regions.

In addition to performing the function of spectrometer, a device in accordance with embodiments of the present invention can be configured so that the spectral information, e.g. the spectral response curve set, closely copies the Red-Green-Blue spectral response curve set present in the human eye, so that a device in accordance with embodiments of the present invention can be used also for color imaging purposes. It is to be noted that in this case no extra optical spectral information such as spectral response curves is necessary, in contrast with conventional color imaging.

Figure 2A:
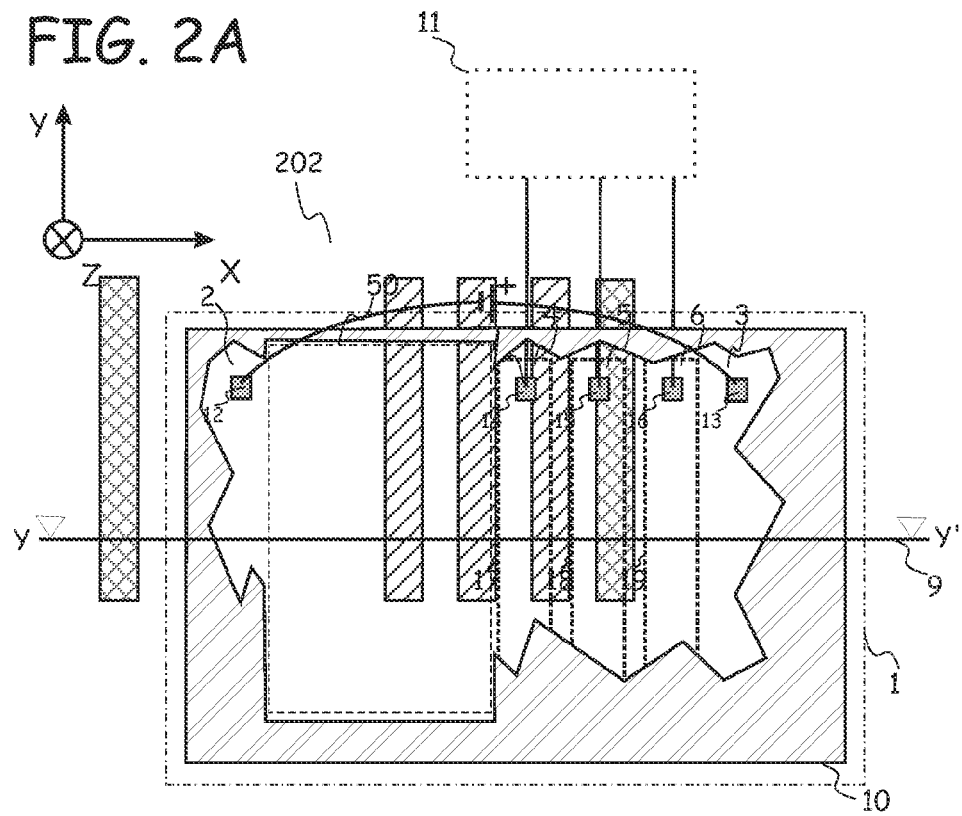
FIG. 2A illustrates a photospectrometer in accordance with a second embodiment of the present invention, with optically sensitive area and detection area being decoupled.

FIG. 2A shows a top view of a photospectrometer 202 in accordance with a second embodiment of the present invention, whereby impinging electromagnetic radiation, e.g. light, is captured by an electromagnetically sensitive area, e.g. an optically sensitive area 50, which is separate from the detection regions 4, 5 and 6. The number of detection regions illustrated in this embodiment is three; however, this is not limiting for the present invention. More or less detection regions can be present. The detection regions are covered by a radiation shielding, e.g. a shielding metal 10. This way, the sensitive area is surrounded by the radiation shielding.

Figure 2B:
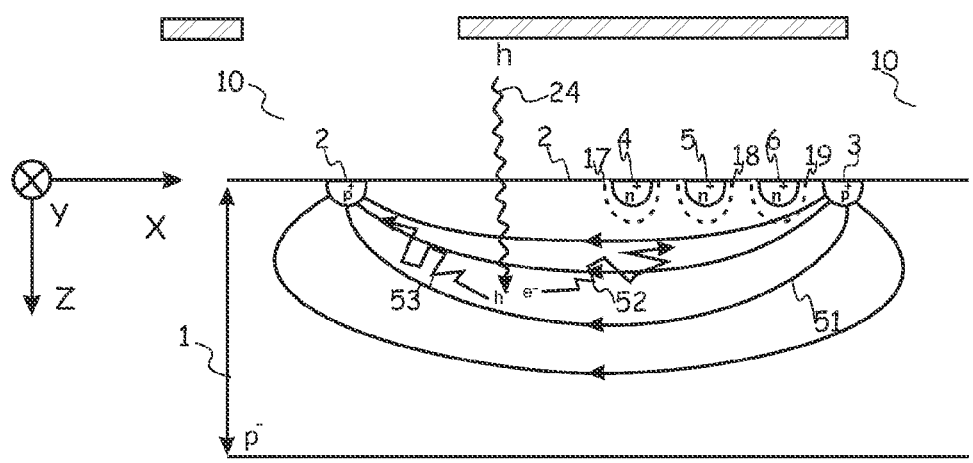
FIG. 2B illustrates a cross-section of the photospectrometer according to the second embodiment as depicted in FIG. 2A.

FIG. 2B represents a cross-section along the line Y-Y' of the photo-spectrometer embodiment illustrated in FIG. 2A. Impinging electromagnetic radiation, e.g. light, generates electron hole pairs with a lateral distribution depending in the lateral intensity distribution of the radiation and a vertical distribution depending on the spectrum of the impinging electromagnetic radiation. Means are provided for generating a majority carrier current in the substrate. Again, the electric field caused by the majority carrier current 51 will provide each of the at least one detection region, in this example detection regions 4, 5 and 6, with a distinct spectral response. It is to be noted that again the number of detection regions as well as the pitch of the detection regions can be engineered to optimize the resulting set of spectral information, e.g. the spectral response curve-set.

It will be clear to a person skilled in the art that photo-spectrometers according to embodiments of the present invention can be configured with elements from both the embodiment described in FIG. 1A and the embodiment described in FIG. 2A.

Figure 3A:
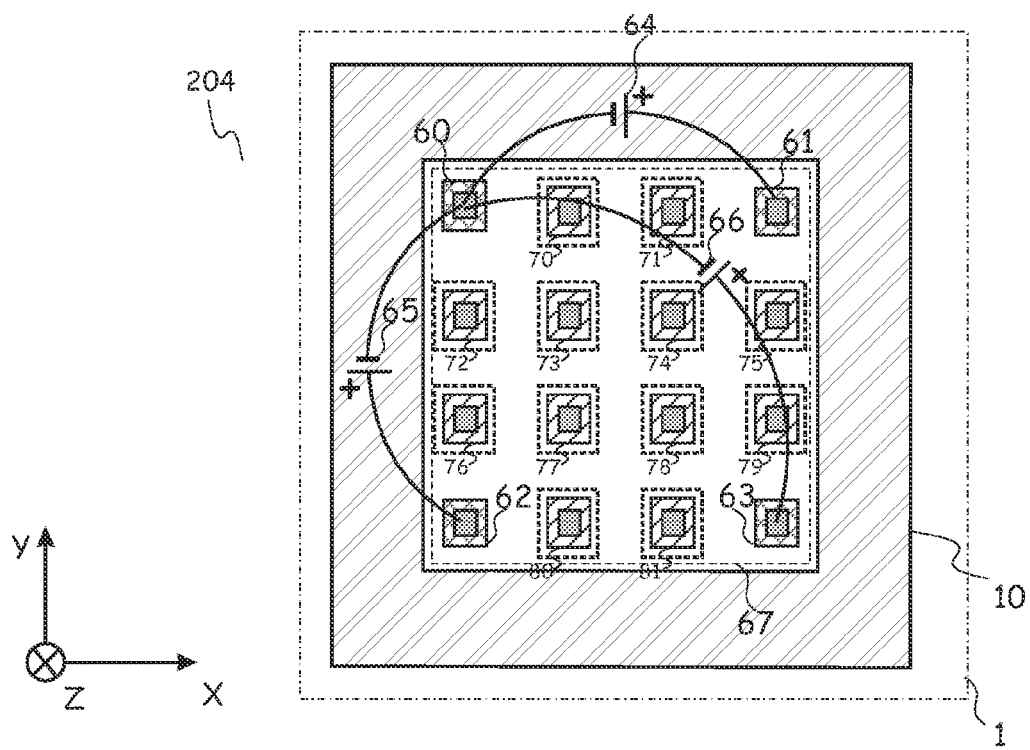
FIG. 3A illustrates a photospectrometer according to a third embodiment of the present invention, with detection region arranged in 2 dimensions.

FIG. 3A shows a top view of a photospectrometer 204 according to a third embodiment of the present invention. In this embodiment, the detection regions, in the example illustrated detections regions 70 to 81, are spread in an array along 2 dimensions of the substrate 1. In the example illustrated the array is a regular array; however, this is not limiting for the present invention. A plurality of conductive regions is provided, for sourcing or draining current from a plurality of current sources. In the example illustrated, four conductive regions 60, 61, 62, 63 are provided, at the corners of the array of detection regions 70 to 81. This, again, is not intended to be limiting for the present invention. A different number of conductive regions, between two and any suitable number higher than two, may be provided. Moreover, these conductive regions do not need to be placed at corners of an array of detection regions. In alternative embodiments, the plurality of conductive regions could be placed around an array of detection regions. The placement around the array of detection regions can be so as to enclose the array of detection regions.

This placement around the array of detection regions can be performed in a regular or in an irregular manner. The spacing between two neighbouring detection regions can be the same as the spacing between a conductive region for sourcing or draining current from a current source and a neighbouring detection region.

In the embodiment illustrated in FIG. 3A, a majority carrier current is injected and drained at p+-type regions at the corners 60, 61, 62 and 63 of the array. Again, due to the transport of the generated electrons caused by the electric field present in the substrate 1 induced by the injection of a majority carrier current, each of the detection regions 70 to 81 has a distinct spectral response to the impinging electromagnetic radiation, e.g. light.

Figure 3B:
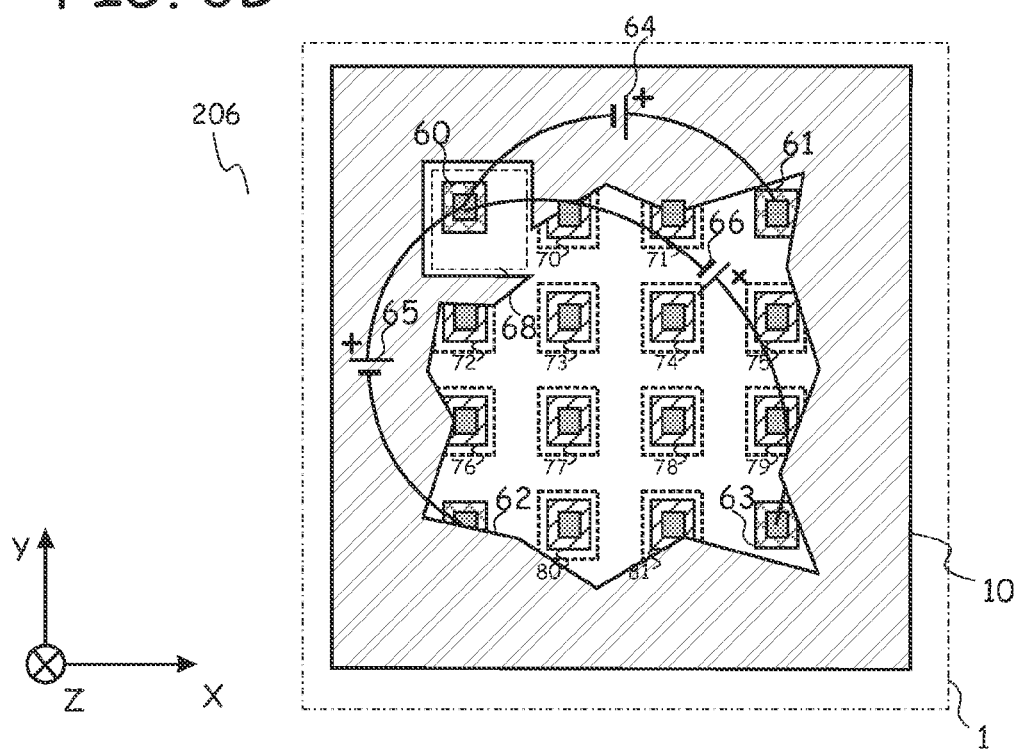
FIG. 3B illustrates a photospectrometer according to a fourth embodiment of the present invention, with detection region arranged in two dimensions and only a small part of the device being optically sensitive.

The shielding layer 10, e.g. metal layer, can be configured such as to allow the electromagnetic radiation to impinge on the sensitive area 67, including where the detection regions are present, as illustrated in FIG. 3A, or as in FIG. 3B, to allow only a portion of the whole embodiment to be sensitive to impinging radiation. In the example illustrated in FIG. 3B, the photo-spectrometer 206 has a sensitive area 68 which does not include the detection areas, i.e. the shielding layer 10 covers the detection areas.

Figure 4:
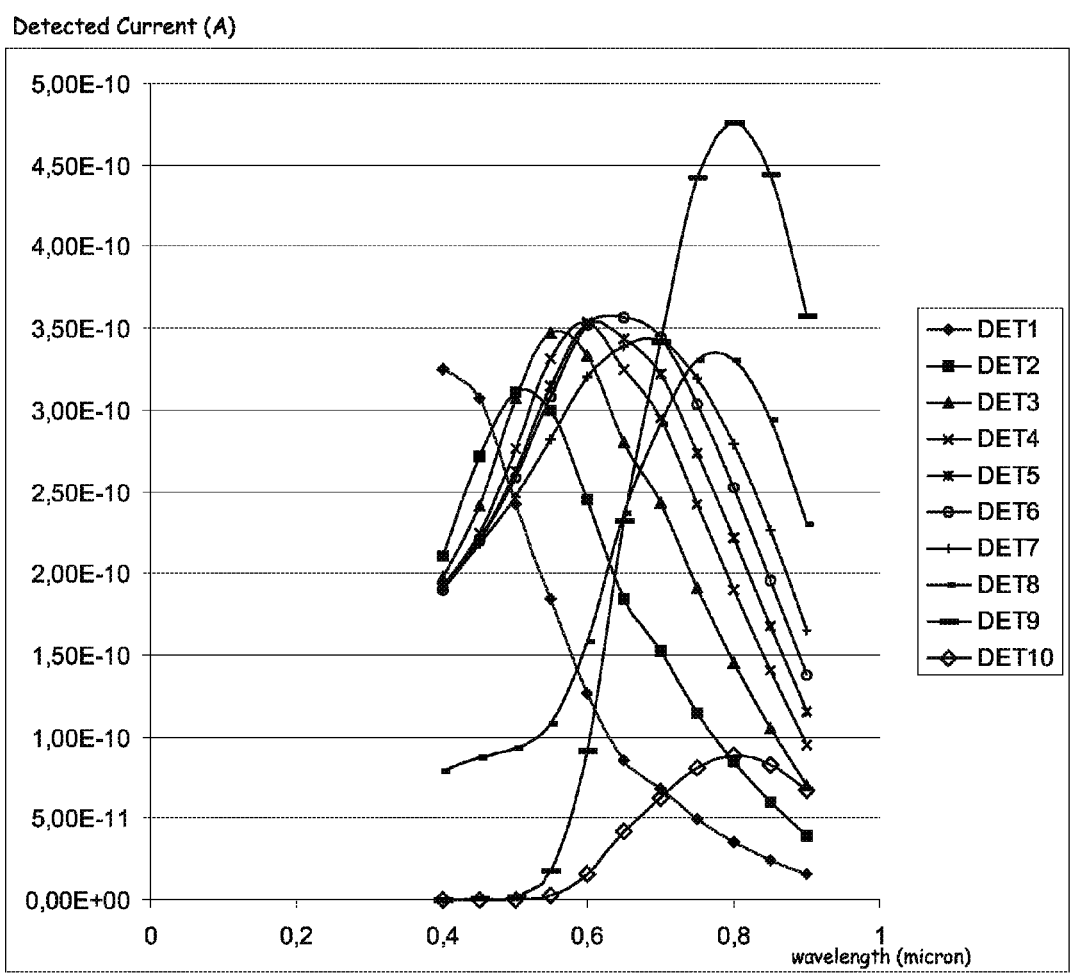
FIG. 4 shows simulated optical response curves of a photospectrometer implemented according to the embodiment illustrated in FIG. 1A, with 10 detectors.

FIG. 4 shows simulated spectral responses of a device configured according to the embodiment of FIG. 1A, with 10 detection regions. In this embodiment, 10 detection regions are provided one next to the other in a row. A shielding layer 10 is provided, which at least partly surrounds the detection regions. The shielding layer 10 does not cover the detection regions. The device was configured according to 0.35 micron design rules in a p– 20 Ohm.cm substrate. A voltage of 2V was applied over the inject and drain regions 2, 3. The device was illuminated with a uniform beam of configurable wavelength and 0.1 mW/cm$^2$ intensity. FIG. 4 shows the individual spectral responses of the different detection regions DET1 to DET10, clearly showing a simulated spectral response curve set of 10 different spectral response curves for one situation of the electric field. The spectral response curves are obtained as extrapolations of the simulated sets of spectral information.

Figure 5A:
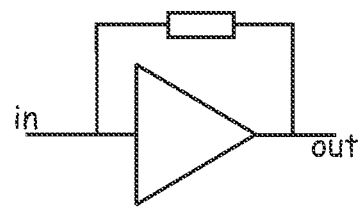
FIG. 5A illustrates a trans-impedance amplifier for read-out.
Figure 5B:
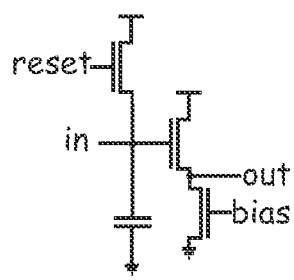
FIG. 5B illustrates an integrating read-out circuit.

FIG. 5A shows a trans-impedance amplifier, easily recognizable by a person skilled in the art, which can be used as read-out circuit 11 to read-out the values of the detection currents detected on the detection regions. The advantage of using a trans-impedance amplifier is the fact that the voltage applied on the detection regions can be held constant irrespective of the detection currents. As such, the depletion widths surrounding the detection regions remain constant as well. The drawback is a lower Signal-to-Noise Ratio (SNR) with respect to, for example, the circuits shown in FIG. 5B. FIG. 5B shows a possible circuit to optimize SNR to read-out the detection current, by integrating the current on a capacitance or parasitic capacitance during a set integration time. Each detection region can be coupled to such a read-out circuit, or the read-out circuitry can be shared among different detection regions and coupled to one of the detection regions with a switch.

A common problem in spectroscopy is the separation of the signal from the electromagnetic radiation 24 used for excitation of a sample under test and the subsequent electromagnetic signal of the sample under test itself. Often, the spectroscopy takes place in two phases, the first one being the excitation phase whereby the sample under test is excited with for example a laser-beam, the second phase being the measurement phase wherein the spectrum of the emitted electromagnetic radiation, e.g. light, of the sample under test is to be measured. To do this, the detector must have a controllable window in time in which measurement takes place, preferably starting at the end of the first phase and the beginning of the second phase.

Figure 6A:
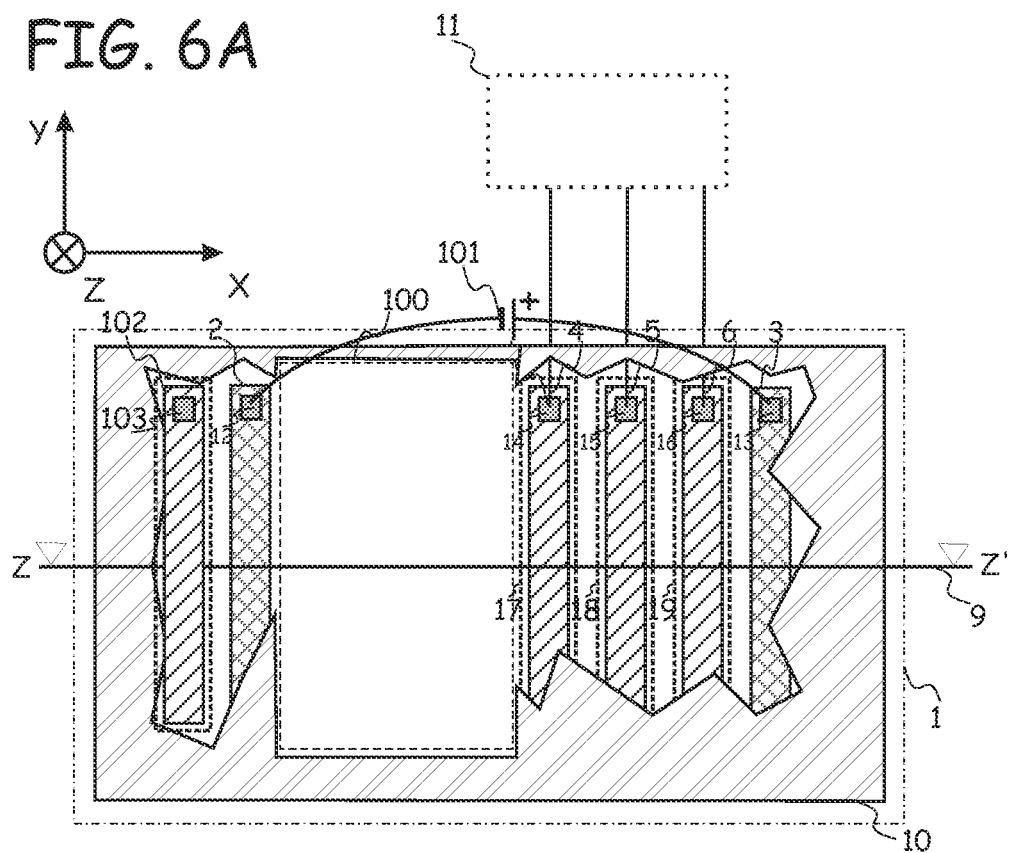
FIG. 6A illustrates a photospectrometer according to a further embodiment of the present invention, with controllable sensitive time-window.

FIG. 6A shows the top view of a possible embodiment which combines spectrometry with controllable windowing. The embodiment is largely identical to the embodiment in FIG. 2A. The optically sensitive area 100 captures the impinging electromagnetic radiation, e.g. light, while the detection regions, in this example 4, 5 and 6 are shielded from direct illumination by a radiation shielding, e.g. shielding metal 10. To the left of the p+ region 2 an extra detection region such as an n+ or nwell detection region 102 is provided. A source 101 couples the p+ regions 2 and 3 and allows a majority carrier current, in this example a hole current, to flow through the substrate 1.

Figure 6B:
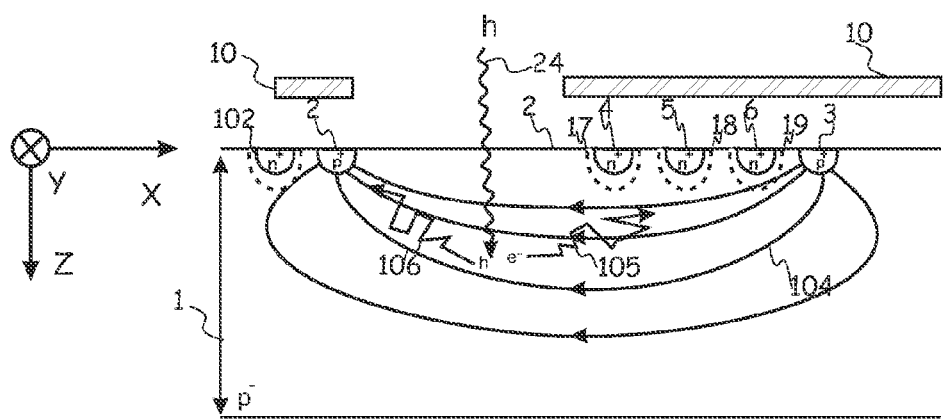

FIG. 6B shows a cross-section of FIG. 6A taken along Z-Z'. In FIG. 6B, the amplitude of the source 101 is such that the majority carrier current 104, here hole current 104, flows from p+ region 3 to p+ region 2. If electromagnetic radiation, e.g. light, in the form of a photon 24 penetrates the substrate 1 in the optically sensitive area 100, a reaction takes place at a certain position marked by the star "*" and an electron hole pair is generated. The hole will be dragged towards the p+ region 2 along with the sea of majority carriers present in the substrate caused by the source 101. The electron in contrast experiences a force by the electric field caused by the majority carrier current 104 and is transported on a path 105 towards p+-region 3. The path 105 is generated by the combination of the above-mentioned force by the majority carrier current, diffusion and interactions with phonons. However, when the minority charge carrier, in the example given the electron, nears the vicinity of one of the depletion regions 17, 18 and 19 of the detection regions 4, 5 and 6 respectively, the electron will be detected at that detection region. Again, such as explained in FIG. 2A, the different detection regions, in this example 4, 5 and 6, will have a different spectral response to the impinging electromagnetic radiation, e.g. light, due to the electric field caused by the majority carrier current 104.

Figure 6C:
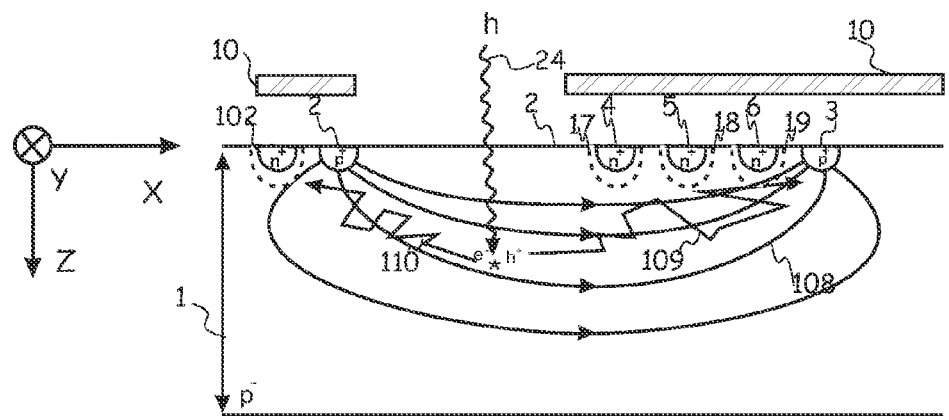
FIG. 6C illustrates a cross-section of the photospectrometer according to the embodiment illustrated in FIG. 6A, when the detection regions on the right-hand side of the optically sensitive area are OFF.

FIG. 6C shows a cross-section of the embodiment of FIG. 6A taken along the line Z-Z'. In FIG. 6C the amplitude of the source 101 is such that the majority carrier current 108, here the hole current 108, flows from the p+ region 2 to the p+ region 3 through the substrate 1, i.e. the majority carrier current has switched direction. If electromagnetic radiation, e.g. light, in the form of a photon 24 penetrates the substrate 1 in the optically sensitive area 100, a reaction takes place at a certain position marked by the star "*" and an electron hole pair is generated. The hole will be dragged towards the p+ region 3 along with the sea of majority carriers present in the substrate caused by the source 101. The electron in contrast experiences a force by the electric field caused by the majority carrier current 108 and is transported on a possible path 110 towards p+-region 2. The path 110 is generated by the combination of the above-mentioned force, diffusion and interactions with phonons. However, when the minority charge carrier, in the example given the electron, nears the vicinity of one the depletion region of detection region 102 it will be detected by that detection region 102. The detection regions on the right of the optically sensitive area 100, in this example detection regions 4, 5 and 6 are highly unlikely to detect any of the generated electrons created by electromagnetic radiation, e.g. light, impinging on the optically sensitive area 100 when the majority carrier current has this direction. As such, the detection of electrons by the detection regions on the right of the optically sensitive area 100 can be switched ON (electrons being detected by the plurality of detection regions 4, 5, 6) and OFF (electrons being detected by the supplementary detection region 102) by changing the polarity of the source 101 and hence the direction of the majority carrier current. The electrons generated while detection on detection regions at the right of the optically sensitive area 100 is switched OFF will be detected by the detection region on the left of the optically sensitive area 101, in this example detection region 102.

It is obvious to a person skilled in the arts that such an embodiment can be used to control the active window in time wherein the spectrum of the electromagnetic radiation, e.g. light, capture by the sensitive area 100 is measured. It is also possible to direct the electrons generated by the impinging electromagnetic radiation, e.g. light, to other sets of detection regions, e.g. a supplementary set of detection regions (not illustrated in the drawings), by changing the direction of the electric field generated by the majority carrier current in the substrate. In this way, a person skilled in the arts can design a spectrometric system which can sample the spectrum to be measured in time.

Figure 7:
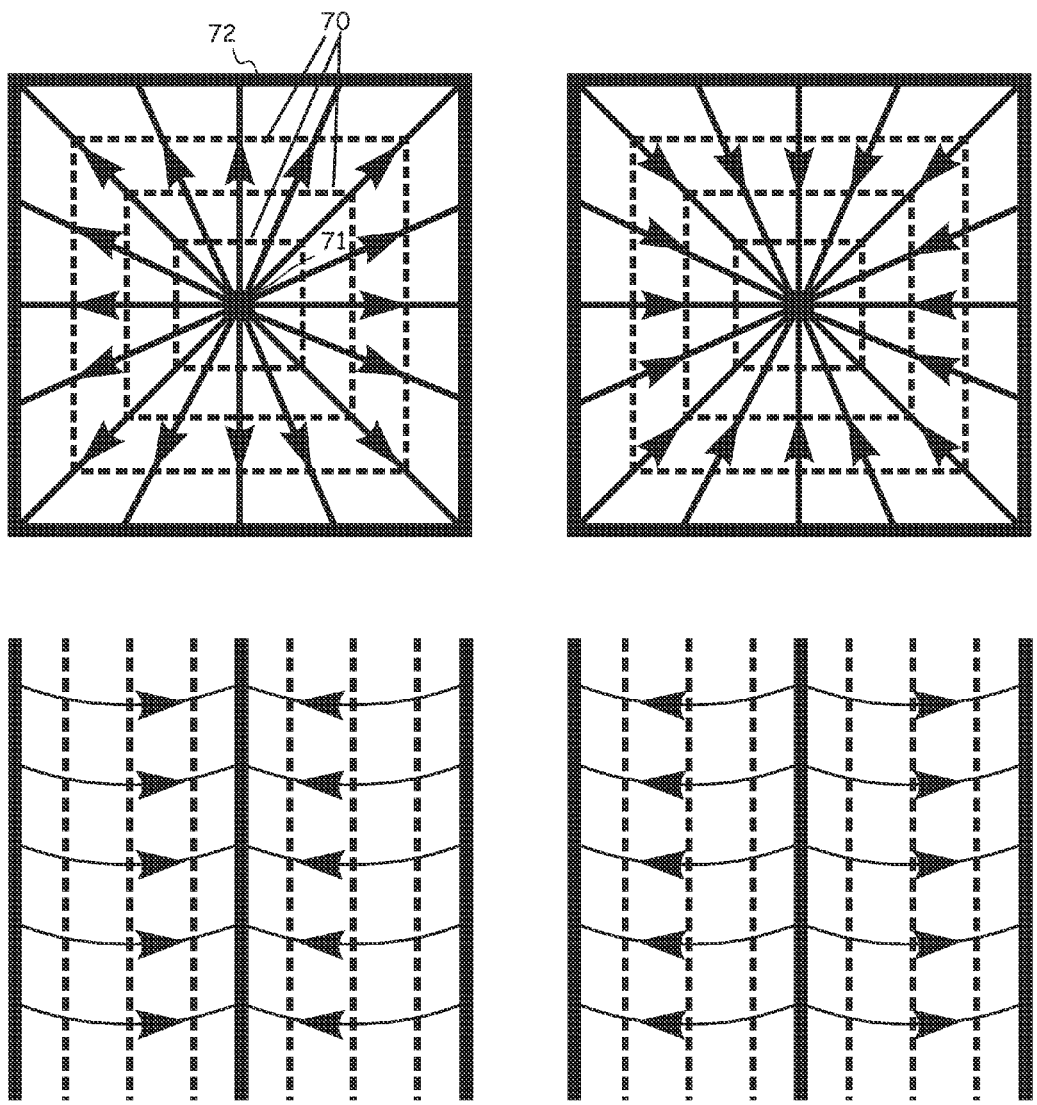
FIG. 7 schematically illustrates possible embodiments of detection region lay-outs which can be used in photospectrometers in accordance with embodiments of the present invention.

FIG. 7 offers a number of schematically shown possible embodiments whereby the dashed lines represent detection regions 70, the thick solid line the conductive regions 71, 72, e.g. p+ regions, for sourcing and draining the majority carrier current, and the thin solid lines with arrows the presence and direction of a majority carrier current flowing in the substrate between 2 or more p+ regions.

It can be seen that in between a conductive region for sourcing and a conductive region for draining the majority carrier current a plurality of detection regions are present.

In a further aspect, the present invention also relates to processing systems adapted for performing the different method steps of method embodiments in accordance with the present invention. The different steps may be implemented in the processing system as hardware or as software. Such a processing system may include at least one programmable processor coupled to a memory subsystem that includes at least one form of memory, e.g., RAM, ROM, and so forth. A storage subsystem may be included that has at least one disk drive and/or CD-ROM drive and/or DVD drive. In some implementations, a display system, a keyboard, and a pointing device may be included as part of a user interface subsystem to provide for a user to manually input information, such as e.g. a parameter determining the direction of the majority carrier current in the substrate. Ports for inputting and outputting data also may be included, e.g. for inputting pre-determined sets of spectral information, e.g. sets of spectral response curves, or for outputting the results of the spectrometer action. More elements such as network connections, interfaces to various devices, and so forth, may be included. The various elements of the processing system may be coupled in various ways, including via a bus subsystem. The memory of the memory subsystem may at some time hold part or all of a set of instructions that when executed on the processing system implement the step(s) of the method embodiments of the present invention. Thus, while a processing system as such is prior art, a system that includes the instructions to implement aspects of the present invention is not prior art.

The present invention also includes a computer program product which provides the functionality of any of the methods according to the present invention when executed on a computing device.

Nowadays, such software is often offered on the Internet or a company Intranet for download, hence the present invention includes transmitting the computer product according to the present invention over a local or wide area network.

Further, the present invention includes a data carrier which stores the computer product in a machine readable form and which executes at least one of the methods of the invention when executed on a computing device. The terms "data carrier", "carrier medium" and "computer readable medium" as used herein refer to any medium that participates in providing instructions to a processor for execution. Such a medium may take many forms, including but not limited to, non-volatile media, volatile media, and transmission media. Non-volatile media includes, for example, optical or magnetic disks, such as a storage device which is part of mass storage. Volatile media includes dynamic memory such as RAM.

Common forms of computer readable media include, for example a floppy disk, a flexible disk, a hard disk, magnetic tape, or any other magnetic medium, a CD-ROM, any other optical medium, punch cards, paper tapes, any other physical medium with patterns of holes, a RAM, a PROM, an EPROM, a FLASH-EPROM, any other memory chip or cartridge, a carrier wave as described hereafter, or any other medium from which a computer can read.

Various forms of computer readable media may be involved in carrying one or more sequences of one or more instructions to a processor for execution. For example, the instructions may initially be carried on a magnetic disk of a remote computer. The remote computer can load the instructions into its dynamic memory and send the instructions over a telephone line using a modem. A modem local to the computer system can receive the data on the telephone line and use an infrared transmitter to convert the data to an infrared signal. An infrared detector coupled to a bus can receive the data carried in the infra-red signal and place the data on the bus. The bus carries data to main memory, from which a processor retrieves and executes the instructions. The instructions received by main memory may optionally be stored on a storage device either before or after execution by a processor. The instructions can also be transmitted via a carrier wave in a network, such as a LAN, a WAN or the internet. Transmission media include coaxial cables, copper wire and fiber optics, including the wires that comprise a bus within a computer. Transmission media can also take the form of acoustic or light waves, such as those generated during radio wave and infra-red data communications.

It is to be understood that although preferred embodiments, specific constructions and configurations have been discussed herein for devices according to the present invention, various changes or modifications in form and detail may be made without departing from the scope of this invention as defined by the appended claims. Steps may be added or deleted to methods described within the scope of the present invention.

The invention claimed is:

1. A spectrometer device for detection of electromagnetic radiation impinging on a substrate, the impinging electromagnetic radiation generating pairs of majority and minority carriers in the substrate, the spectrometer device comprising:
at least one photospectrometer having at least one sensitive area for detecting electromagnetic radiation impinging on the substrate, each of the at least one photospectrometer comprising at least two detection regions associated with the at least one sensitive area, wherein the at least two detection regions are laterally arranged spaced apart from each other, and wherein the at least two detection regions collect generated minority carriers;
means for generating, in the substrate, a majority carrier current, the minority carriers being directed under influence of the majority carrier current towards the at least two detection regions, and means for determining spectral information based on the minority carriers collected at the at least two detection regions.

2. A spectrometer device according to claim 1, furthermore comprising at least one current source region and at least one current drain region, the means for generating the majority carrier current is adapted for generating this majority carrier current between the at least one current source region and the at least one current drain region, and having a spectral response predetermined with respect to a controllable window or the majority carrier.

3. A spectrometer device according to claim 1, furthermore comprising readout means for reading out the minority carriers collected in the at least two detection regions, wherein the probability of generating pairs of majority and minority carriers deeper in the substrate is proportional to the wavelength of the electromagnetic radiation.

4. A spectrometer device according to claim 3, wherein the readout means comprises a transimpedance amplifier.

5. A spectrometer device according to claim 1, furthermore comprising means configured to compare a determined spectral information with pre-determined sets of spectral information.

6. A spectrometer device according to claim 5, wherein a pre-determined set of spectral information closely copies a Red-Green-Blue spectral response curve set present in a human eye.

7. A spectrometer device according to claim 1, furthermore comprising means for changing a parameter of the majority carrier current in the substrate.

8. A spectrometer device according to claim 7, wherein the parameter is any of polarity, amplitude, shape and/or modulation frequency.

9. A spectrometer device according to claim 7, furthermore comprising at least one supplementary detection region for collecting generated minority carriers, the at least two detection regions and the at least one supplementary detection region arranged so that they collect minority carriers, depending on the parameter of the majority carrier current in the substrate.

10. A method for performing spectrometry of electromagnetic radiation impinging on a substrate, the impinging electromagnetic radiation generating pairs of majority and minority carriers in the substrate, the method comprising—
providing at least one photospectrometer having at least one sensitive area for detecting electromagnetic radiation impinging on the substrate, each of the at least one photospectrometer comprising at least two detection regions associated with the at least one sensitive area, wherein the at least two detection regions are laterally arranged spaced apart from each other;
generating a majority carrier current in the substrate,
directing generated minority carriers under influence of the generated majority carrier current towards the at least two detection regions, and collecting the minority carriers at the at least two detection regions, and determining spectral information based on the minority carriers collected at the at least two detection regions.

11. A method according to claim 10, furthermore comprising providing sets of spectral information for the at least two detection regions, and comparing the determined spectral information with the provided sets of spectral information.

12. A method according to claim 11, wherein providing sets of spectral information for the at least two detection regions comprises determining spectral information for minority carriers collected at the at least two detection regions when the electromagnetic radiation impinging on the substrate is electromagnetic radiation with a known spectrum.

13. A method according to claim 12, wherein providing sets of spectral information for the at least two detection regions furthermore comprises determining spectral information for minority carriers collected at the at least two detection regions with a majority carrier current with known parameters being generated.

14. A controller for controlling spectrometry of electromagnetic radiation impinging on a substrate, the impinging electromagnetic radiation generating pairs of majority and minority carriers in the substrate, the controller comprising
at least one photospectrometer having at least one sensitive area for detecting electromagnetic radiation impinging on the substrate, each of the at least one photospectrometer comprising at least two detection regions associated with the at least one sensitive area, wherein the at least two detection regions are laterally arranged spaced apart from each other;
control means configured to control generation of a majority carrier current in the substrate, thus directing generated minority carriers under influence of the generated majority carrier current towards the at least two detection regions, and collecting the minority carriers at the at least two detection regions, and calculating means for determining spectral information based on minority carriers collected at the at least two detection regions.

15. A spectrometer device for detection of electromagnetic radiation impinging on a substrate, the impinging electromagnetic radiation generating pairs of majority and minority carriers in the substrate, the spectrometer device comprising:
at least one photospectrometer having at least one sensitive area for detecting electromagnetic radiation impinging on the substrate, each of the at least one photospectrometer comprising at least two detection regions associated with the at least one sensitive area, wherein the at least two detection regions are laterally arranged spaced apart from each other, and wherein the at least two detection regions collect generated minority carriers;
current generator for generating in the substrate, a majority carrier current, the minority carriers being directed under influence of the majority carrier current towards the at least two detection regions, and
spectral analyser for generating spectral information based on the minority carriers collected at the at least two detection regions.

16. A spectrometer device according to claim 15, furthermore comprising at least one current source region and at least one current drain region, the current generator is adapted for generating this majority carrier current between the at least one current source region and the at least one current drain region.

17. A spectrometer device according to claim 16, furthermore comprising readout circuitry for reading out the minority carriers collected in the at least two detection regions.

18. A spectrometer device according to claim 16, furthermore comprising a comparator for comparing the determined spectral information with pre-determined sets of spectral information.

19. A spectrometer device according to claim 16, furthermore comprising means for changing a parameter of the majority carrier current in the substrate.

20. A spectrometer device according to claim 19, furthermore comprising at least one supplementary detection region for collecting generated minority carriers, the at least two detection regions and the at least one supplementary detection region arranged so that they collect minority carriers, depending on the parameter of the majority carrier current in the substrate; wherein the parameter is any of polarity, amplitude, shape and/or modulation frequency.

\* \* \* \* \*